(12) United States Patent
Hwang et al.

(10) Patent No.: US 10,108,290 B2
(45) Date of Patent: Oct. 23, 2018

(54) SELF-CAPACITIVE TOUCH SENSOR INTEGRATED TYPE DISPLAY DEVICE AND METHOD FOR MANUFACTURING THE SAME

(71) Applicant: LG Display Co., Ltd., Seoul (KR)

(72) Inventors: Kwangjo Hwang, Goyang-si (KR); Joonsuk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 400 days.

(21) Appl. No.: 14/983,543

(22) Filed: Dec. 30, 2015

(65) Prior Publication Data
US 2016/0349899 A1  Dec. 1, 2016

(30) Foreign Application Priority Data
May 29, 2015 (KR) .................. 10-2015-0076286

(51) Int. Cl.
G06F 3/041 (2006.01)
G09G 3/32 (2016.01)
G06F 3/044 (2006.01)

(52) U.S. Cl.
CPC ............ *G06F 3/0416* (2013.01); *G06F 3/044* (2013.01); *G06F 3/0412* (2013.01); *G06F 2203/04103* (2013.01); *G06F 2203/04112* (2013.01)

(58) Field of Classification Search
CPC ........ G06F 3/041; G06F 3/044; G06F 3/0412; G06F 3/0416; H01L 27/32; H01L 27/323; H01L 51/00; H01L 51/10; H01L 51/40; H01L 51/50; H01L 51/56; H01L 51/5256; G09G 3/32; G02F 1/13338
See application file for complete search history.

(56) References Cited

U.S. PATENT DOCUMENTS

| 2006/0170340 A1* | 8/2006 | Tzen | H01L 27/322 313/506 |
| 2012/0205678 A1* | 8/2012 | Ikeda | H01L 27/3276 257/88 |
| 2012/0205698 A1* | 8/2012 | Yamazaki | H01L 51/524 257/98 |
| 2017/0090644 A1* | 3/2017 | Yao | G06F 3/0416 |

FOREIGN PATENT DOCUMENTS

| KR | 10-2013-0046913 A | 5/2013 |
| KR | 10-2014-0082089 A | 7/2014 |
| KR | 10-2014-0126578 A | 10/2014 |
| KR | 10-2014-0148176 A | 12/2014 |
| KR | 10-2015-0011963 A | 2/2015 |

OTHER PUBLICATIONS

Korean Office Action, Korean Application No. 10-2015-0076286, dated Jul. 11, 2016, 10 pages (with concise explanation of relevance).

* cited by examiner

*Primary Examiner* — Chanh Nguyen
*Assistant Examiner* — Nguyen H Truong
(74) *Attorney, Agent, or Firm* — Fenwick & West LLP

(57) ABSTRACT

A touch sensing display device that includes a bank layer having a bank hole, a mesh barrier on the bank layer, and a cathode electrode of at least an organic light emitting diode (OLED). The mesh barrier is between the cathode electrode and one or more other cathode electrodes. The cathode electrode is also a touch electrode. A portion of the cathode electrode is in the bank hole and under the mesh barrier.

15 Claims, 12 Drawing Sheets

SELF-CAPACITIVE TOUCH SENSOR INTEGRATED TYPE DISPLAY DEVICE AND METHOD FOR MANUFACTURING THE SAME

This application claims the benefit of Korea Patent Application No. 10-2015-0076286 filed on May 29, 2015, which is incorporated herein by reference for all purposes as if fully set forth herein.

BACKGROUND

Field of the Disclosure

Embodiments of the disclosure relate to a touch sensor integrated type display device, and more particularly to a self-capacitive touch sensor integrated type display device and a method for manufacturing the same.

Discussion of the Related Art

In recent years, various input devices, such as a keyboard, a mouse, a track ball, a joystick, and a digitizer, have been used to allow users to interface with home appliances or information telecommunication devices. However, when the user makes use of these input devices, the user's dissatisfaction increases because the user is required to learn how to use the input devices and the input devices occupy space. Thus, a demand for a convenient and simple input device capable of reducing erroneous operations is increasing. In response to the demand, a touch sensor was proposed to enable the user to input information by directly touching the screen or approaching the screen with his or her hand or a pen while he or she watches display devices of the home appliances or display devices of the information telecommunication devices.

The touch sensor has a simple configuration capable of reducing erroneous operations. The user can also perform an input action without using a separate input device and can quickly and easily manipulate a display device through the contents displayed on the screen. Thus, the touch sensor has been applied to various display devices.

The touch sensor may be classified into an add-on type touch sensor, an on-cell type touch sensor, and an integrated type (or in-cell type) touch sensor depending on its structure. The add-on type touch sensor is configured such that the display device and a touch panel including the touch sensor are individually manufactured and then the touch panel is attached to an upper substrate of the display device. The on-cell type touch sensor is configured such that the touch sensor is directly formed on the surface of an upper glass substrate of the display device. The in-cell type touch sensor is configured such that the touch sensor is mounted inside the display device to thereby achieve thin profile of the display device and increase the durability of the display device.

There is a problem of an increase in a thickness of the display device because the add-on type touch sensor has a structure in which the touch sensor is mounted on the display device. Further, the visibility of the display device is reduced by a reduction in brightness of the display device resulting from the increase in the thickness of the display device.

The on-cell type touch sensor shares a glass substrate with the display device through the structure, in which it is formed on the surface of the glass substrate of the display device. Therefore, a thickness of the display device using the on-cell type touch sensor is less than a thickness of the display device using the add-on type touch sensor. However, the entire thickness of the display device using the on-cell type touch sensor increases because of a touch driving electrode layer, a touch sensing electrode layer, and an insulating layer for insulating the touch driving electrode layer and the touch sensing electrode layer which constitute the on-cell type touch sensor. Hence, the number of manufacturing processes increases, and the manufacturing cost increases.

The in-cell type touch sensor can solve the problems generated in the add-on type touch sensor and the on-cell type touch sensor and has advantages of a thinner profile and improved durability. The in-cell type touch sensor may be divided into a mutual capacitive touch sensor and a self-capacitive touch sensor.

The mutual capacitive touch sensor crosses X-axis electrode lines (for example, driving electrode lines) and Y-axis electrode lines (for example, sensing electrode lines) in a touch electrode formation area of a touch panel to form a matrix, applies a driving pulse to the X-axis electrode lines, and senses changes in voltages generated in sensing nodes defined as crossings of the X-axis electrode lines and the Y-axis electrode lines through the Y-axis electrode lines, thereby deciding whether or not a touch operation is performed.

In the self-capacitive touch sensor, touch electrodes and routing wires are formed in a touch panel, and the touch electrodes are respectively connected to the routing wires formed along one direction. The self-capacitive touch sensor is more advantageous than the mutual capacitive touch sensor because it has a thinner profile. The self-capacitive touch sensor includes a capacitance produced in each touch electrode. When a driving signal is applied to the touch electrode through the routing wire, charges are accumulated on the self-capacitive touch sensor. In this instance, when a user touches the touch electrode with his or her finger or a conductive object, a capacitance of the self-capacitive touch sensor varies. Therefore, it may be decided whether or not the self-capacitive touch sensor is touched using the fact that a capacitance of the self-capacitive touch sensor the user touches is different from a capacitance of the self-capacitive touch sensor the user does not touch.

A self-capacitive touch sensor integrated type display device may be theoretically applied to various types of flat panel displays. However, there are few examples of the self-capacitive touch sensor integrated type display device applied to display devices other than a liquid crystal display. An organic light emitting diode (OLED) display has recently replaced the liquid crystal display because of advantages including a fast response time, an excellent emission efficiency, an excellent luminance, a wide viewing angle, etc. However, the self-capacitive touch sensor integrated type display device has not been yet used in the OLED display due to a lack of technology.

SUMMARY

Embodiments of the disclosure provide a self-capacitive touch sensor integrated type display device aimed at an organic light emitting diode display and a method for manufacturing the same.

In one embodiment, a touch sensing display device includes a bank layer having a bank hole, a mesh barrier on the bank layer, and a cathode electrode of at least an organic light emitting diode (OLED). The mesh barrier is between the cathode electrode and one or more other cathode electrodes. The cathode electrode is also a touch electrode. A portion of the cathode electrode is in the bank hole and under the mesh barrier.

In one embodiment the display device comprises a substrate. A cross section of the mesh barrier has an inverted tapered shape that is tapered towards the substrate. Additionally, at least a portion of the bank hole corresponding to an undercut region under the mesh barrier.

In one embodiment a routing wire is electrically connected to the cathode electrode via the bank hole and to carry a common voltage and touch driving signal to the cathode electrode.

In one embodiment 4, the device comprises an anode of the organic light emitting diode. An auxiliary electrode is coplanar with and comprised of a same material as the anode. The auxiliary electrode electrically connects the routing wire to the cathode electrode.

In one embodiment, the portion of the cathode electrode located in the bank hole is in contact with the auxiliary electrode. In one embodiment, a portion of an organic compound layer of the OLED is located in the bank hole and in contact with the auxiliary electrode.

In one embodiment, the organic compound layer comprises an electron transport layer, an emission layer, and hole transport layer, and a portion of the electron transport layer is in the bank hole while the emission layer and hole transport layer are not in the bank hole. The portion of the electron transport layer is between the cathode electrode and the auxiliary electrode.

In one embodiment, a reflection electrode is integrated with the anode. The auxiliary electrode is also coplanar with and comprised of a same material as the reflection electrode.

In one embodiment, an integrated circuit generates the common voltage and touch driving signal. Another auxiliary electrode is coplanar with and comprised of a same material as the anode. The another auxiliary electrode electrically connects the routing wire to the integrated circuit.

In one embodiment, a method of manufacturing a touch sensing display device is disclosed. The method comprises forming a bank layer having a bank hole. A mesh barrier is formed on the bank layer. A cathode electrode of at least an organic light emitting diode (OLED) is formed. The mesh barrier is between the cathode electrode and other cathode electrodes. The cathode electrode is also a touch electrode and a portion of the cathode electrode is formed in the bank hole and under the mesh barrier.

In one embodiment, the mesh barrier is formed into an inverted tapered shape that is tapered towards the substrate and is undercut in the bank hole while being formed.

In one embodiment, the method comprises forming a routing wire to carry a common voltage and touch driving signal to the cathode electrode, wherein the cathode electrode is electrically connected to the routing wire.

In one embodiment, the method comprises forming an anode of the organic light emitting diode and forming an auxiliary electrode coplanar with and comprised of a same material as the anode. The cathode electrode is formed to electrically connect to the routing wire through the auxiliary electrode.

In one embodiment, the portion of the cathode electrode located in the bank hole is formed in contact with the auxiliary electrode.

In one embodiment, an organic compound layer of the OLED is formed. A portion of the organic compound layer of the OLED is formed in the bank hole and in contact with the auxiliary electrode.

In one embodiment, the method comprises forming a hole transport layer of the OLED; forming an emission layer of the OLED; and forming an electron transport layer of the OLED. A portion of the electron transport layer is formed in the bank hole while the emission layer and hole transport layer are not formed in the bank hole. The portion of the electron transport layer is between the cathode electrode and the auxiliary electrode.

In one embodiment, a reflection electrode is integrated with the anode. The auxiliary electrode is formed to be coplanar with and formed from a same material as the reflection electrode.

In one embodiment, another auxiliary electrode is formed to be coplanar with and comprised of the same material as the anode. The another auxiliary electrode electrically connects the routing wire to an integrated circuit.

In one embodiment, the cathode electrode is formed with sputtering.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure.

A self-capacitive touch sensor integrated type display device (hereinafter, referred to as "a touch sensor integrated type display device") according to exemplary embodiments of the disclosure is described in detail blow.

Figure 1:
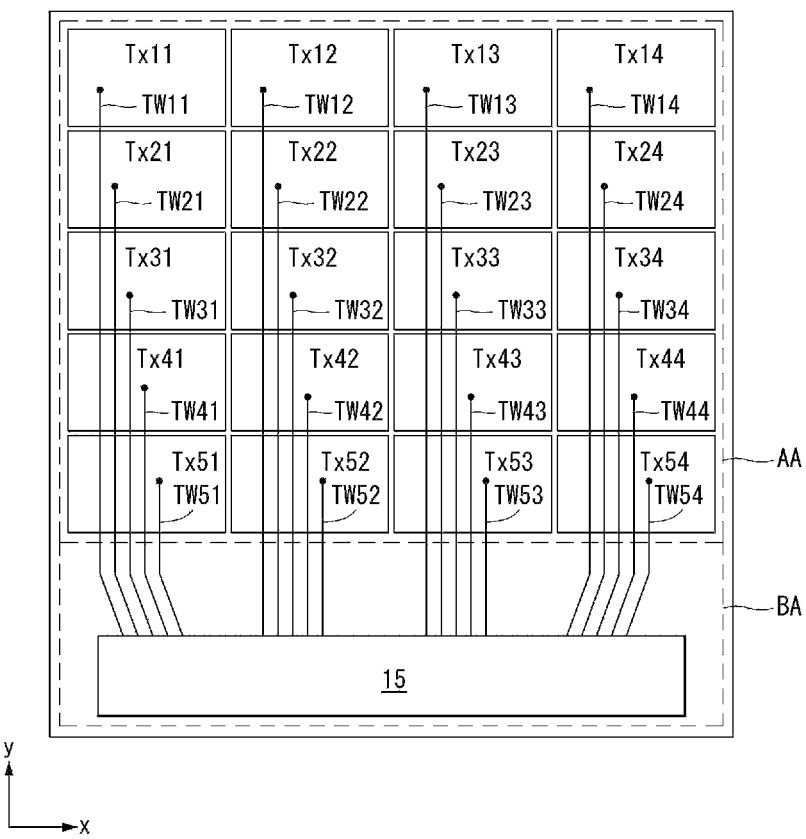
FIG. 1 is a plane view schematically showing configuration of touch and drive electrodes and routing wires connected to the touch and drive electrodes in a touch sensor integrated type display device according to an exemplary embodiment of the disclosure.
Figure 2:
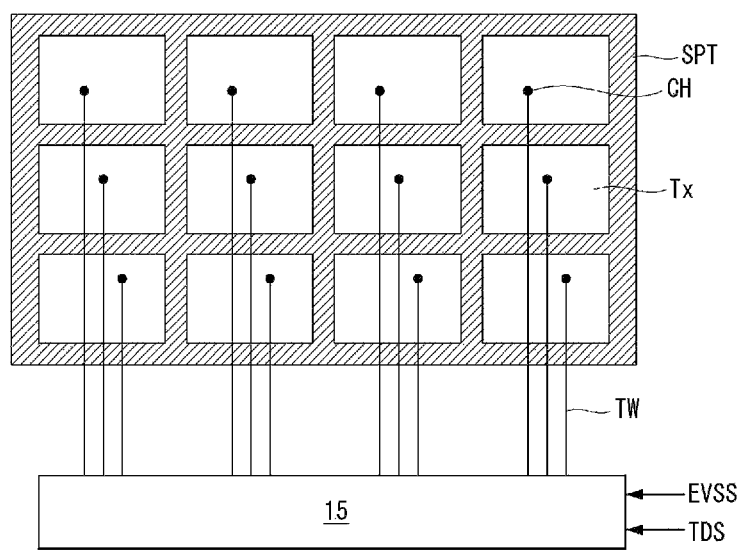
FIG. 2 is a plane view schematically showing configuration, in which a common electrode of an organic light emitting diode (OLED) display is patterned and is used as a touch and drive electrode.

A touch sensor integrated type display device according to an exemplary embodiment of the disclosure is described with reference to FIGS. 1 and 2. FIG. 1 is a plane view schematically showing configuration of touch and drive electrodes and routing wires connected to the touch and drive electrodes in a touch sensor integrated type display device according to an exemplary embodiment of the disclosure. FIG. 2 is a plane view schematically showing configuration, in which a common electrode of an organic light emitting diode (OLED) display is patterned and is used as a touch and drive electrode.

Referring to FIG. 1, a touch sensor integrated type display device according to an exemplary embodiment of the disclosure may include an active area AA, in which a plurality of touch and drive electrodes Tx11 to Tx54 are disposed, and a bezel area BA, which is positioned outside the active area AA and has a display drive and touch sensing integrated circuit (IC) 15. FIG. 1 shows that the touch and drive electrodes Tx11 to Tx54 are disposed in the form of 5×4, as an example. Other disposition configurations may be used for the touch and drive electrodes.

The touch and drive electrodes Tx11-Tx14, Tx21-Tx24, Tx31-Tx34, Tx41-Tx44, and Tx51-T54 are partitioned in the active area AA in a first direction x and a second direction y crossing each other. Routing wires TW11-TW14, TW21-TW24, TW31-TW34, TW41-TW44, and TW51-TW54 are connected to the touch and drive electrodes Tx11-Tx14, Tx21-Tx24, Tx31-Tx34, Tx41-Tx44, and Tx51-T54. The routing wires TW11-TW14, TW21-TW24, TW31-TW34, TW41-TW44, and TW51-TW54 extend from the active area AA to the bezel area BA along the second direction y and are connected to the display drive and touch sensing IC 15.

More specifically, the 1-1 (shorthand notation for row-column) touch and drive electrode Tx11 of a first row and a first column is connected to the 1-1 routing wire TW11, and the 1-1 routing wire TW11 extends from the active area AA to the bezel area BA along the second direction y and is connected to the display drive and touch sensing IC 15. The 2-1 touch and drive electrode Tx21 of a second row and the first column is connected to the 2-1 routing wire TW21, and the 2-1 routing wire TW21 extends from the active area AA to the bezel area BA in parallel with the 1-1 routing wire TW11 and is connected to the display drive and touch sensing IC 15. The 3-1 touch and drive electrode Tx31 of a third row and the first column is connected to the 3-1 routing wire TW31, and the 3-1 routing wire TW31 extends from the active area AA to the bezel area BA in parallel with the 2-1 routing wire TW21 and is connected to the display drive and touch sensing IC 15. The 4-1 touch and drive electrode Tx41 of a fourth row and the first column is connected to the 4-1 routing wire TW41, and the 4-1 routing wire TW41 extends from the active area AA to the bezel area BA in parallel with the 3-1 routing wire TW31 and is connected to the display drive and touch sensing IC 15. The 5-1 touch and drive electrode Tx51 of a fifth row and the first column is connected to the 5-1 routing wire TW51, and the 5-1 routing wire TW51 extends from the active area AA to the bezel area BA in parallel with the 4-1 routing wire TW41 and is connected to the display drive and touch sensing IC 15.

The 1-2 to 5-2 touch and drive electrodes Tx12 to Tx52 arranged on a second column are respectively connected to the 1-2 to 5-2 routing wires TW12 to TW52, and the 1-2 to 5-2 routing wires TW12 to TW52 extend from the active area AA to the bezel area BA in parallel with one another and is connected to the display drive and touch sensing IC 15 in the same manner as the 1-1 to 5-1 touch and drive electrodes Tx11 to Tx51.

Further, the 1-3 to 5-3 touch and drive electrodes Tx13 to Tx53 arranged on a third column are respectively connected to the 1-3 to 5-3 routing wires TW13 to TW53, and the 1-3 to 5-3 routing wires TW13 to TW53 extend from the active area AA to the bezel area BA in parallel with one another and is connected to the display drive and touch sensing IC 15 in the same manner as the 1-1 to 5-1 touch and drive electrodes Tx11 to Tx51.

Further, the 1-4 to 5-4 touch and drive electrodes Tx14 to Tx54 arranged on a fourth column are respectively connected to the 1-4 to 5-4 routing wires TW14 to TW54, and the 1-4 to 5-4 routing wires TW14 to TW54 extend from the active area AA to the bezel area BA in parallel with one another and is connected to the display drive and touch sensing IC 15 in the same manner as the 1-1 to 5-1 touch and drive electrodes Tx11 to Tx51.

Various lines disposed in the bezel area BA include gate lines (not shown) connected to the display drive and touch sensing IC 15 and data lines (not shown), in addition to the 1-1 to 5-4 routing wires TW11-TW51, TW12-TW52, TW13-TW53, and TW14-TW54.

The touch sensor integrated type display device according to the embodiment of the disclosure is implemented as an organic light emitting diode (OLED) display. The OLED display includes a plurality of pixels defined by the gate lines and the data lines. Each pixel includes an organic light emitting diode (OLED) having a self-emission structure. The OLED includes an anode electrode, a cathode electrode, and an organic compound layer formed between the anode electrode and the cathode electrode. The organic compound layer includes an emission layer EML, a hole related layer, and an electron related layer. The hole related layer includes a hole injection layer (HIL) and a hole transport layer (HTL). The electron related layer may include an electron transport layer (ETL) and may further include an electron injection layer (EIL). The OLED display arranges the pixels each including the OLED in a matrix form and adjusts a luminance of the pixels depending on grayscale of video data. Each pixel may include a driving thin film transistor (TFT) controlling a driving current flowing in the OLED based on a gate-to-source voltage of the driving TFT, a capacitor holding the gate-to-source voltage of the driving TFT constant during one frame period, and at least one switching TFT programming the gate-to-source voltage of the driving TFT in response to a gate signal. The driving current is determined by the gate-to-source voltage of the driving TFT based on a data voltage and a threshold voltage of the driving TFT. The luminance of the pixel is proportional to a magnitude of the driving current flowing in the OLED.

In general, a touch resolution may be less than a display resolution. Thus, a plurality of pixels may be arranged in an area, in which one touch and drive electrode Tx is formed. For example, the 1-1 touch and drive electrode Tx11 of the first row and the first column may have the size corresponding to m*n pixels, where m and n are a natural number equal to or greater than 2.

As shown in FIG. 2, the embodiment of the disclosure patterns one common electrode (i.e., the cathode electrode) of the OLED and makes a plurality of touch and drive electrodes Tx, which are electrically separated from one another. In particular, the embodiment of the disclosure simplifies the manufacturing process and increases reliability of the manufacturing process by patterning the cathode electrode through a mesh type barrier SPT. The touch and drive electrode Tx may be connected to the routing wire TW through a bank hole and a first contact hole CH. The embodiment of the disclosure may further include an auxiliary electrode, so as to increase the reliability of the manufacturing process, and also may connect the routing wire TW to the touch and drive electrode Tx through a contact hole process using the auxiliary electrode as a medium.

The embodiment of the disclosure forms a cross section of the barrier SPT in an inverted taper shape and efficiently patterns the cathode electrode. Further, the embodiment of the disclosure positions one side or both sides of the barrier SPT having the inverted taper shape in the bank hole and forms an undercut structure. Hence, the embodiment of the disclosure increases an exposure area of the auxiliary electrode, which will be connected to the touch and drive electrode Tx in the bank hole, and increases the reliability of connection.

In particular, the embodiment of the disclosure may form the cathode electrode through a method different from the organic compound layer, so as to improve step coverage characteristic of the cathode electrode. The embodiment of the disclosure may form the organic compound layer through a thermal evaporation process and may form the cathode electrode through a sputtering process having the good step coverage characteristic.

The embodiment of the disclosure may use a solution process as a method for forming the organic compound layer except the electron transport layer, instead of the thermal evaporation process using a metal mask, so as to improve the process reliability of a large-area display panel. In this instance, the organic compound layer except the electron transport layer does not exist in the bank hole. Thus, the touch and drive electrode Tx more easily penetrates into the bank hole through the sputtering process and is electrically connected to the routing wire TW after passing through the electron transport layer and the auxiliary electrode.

In a display driving mode, the display drive and touch sensing IC 15 drives the gate lines and the data lines of the display panel and supplies a common voltage (hereinafter, referred to as "a low potential power voltage EVSS") to the touch and drive electrode Tx through the routing wire TW. On the other hand, in a touch driving mode, the display drive and touch sensing IC 15 supplies a touch driving signal TDS to the touch and drive electrode Tx through the routing wire TW and scans changes in a capacitance of the touch and drive electrode Tx before and after a touch operation, thereby determining a position of the touch and drive electrode Tx, on which the touch operation is performed. The routing wire TW thus carries both a common voltage and touch driving signals to the touch and drive electrodes Tx, depending on the mode.

The display drive and touch sensing IC 15 assigns an active period to each of successive image frames for the display driving mode. In this instance, the display drive and touch sensing IC 15 performs the touch driving mode in vertical blanking periods between the active periods. In the vertical blanking periods, an image is not displayed. In the vertical blanking periods, the display drive and touch sensing IC 15 supplies a load free signal of the same phase as the touch driving signal TDS to the data lines, the gate lines, and driving power supply lines, thereby minimizing an influence of a parasitic capacitance applied to the touch and drive electrode Tx.

Figure 3:
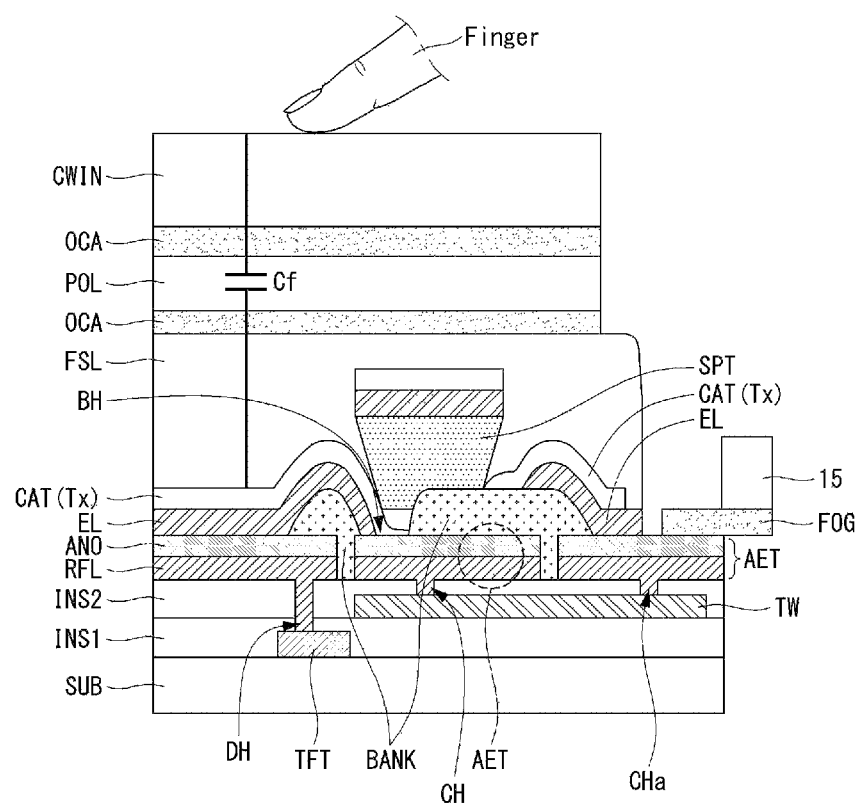
FIG. 3 is a cross-sectional view of a touch sensor integrated type display device according to an exemplary embodiment of the disclosure.

FIG. 3 is a cross-sectional view of a touch sensor integrated type display device, aimed at an OLED display, according to an exemplary embodiment of the disclosure.

Referring to FIG. 3, the touch sensor integrated type display device according to the embodiment of the disclosure includes a TFT, a routing wire TW, first and second insulating layers INS1 and INS2, an auxiliary electrode AET which passes through the second insulating layer INS2 and is connected to a routing wire TW, a bank pattern BANK which includes a bank hole BH and exposes a portion of the auxiliary electrode AET, a barrier SPT positioned on the bank pattern BANK, and a cathode electrode CAT which is patterned and partitioned by the barrier SPT to form touch and drive electrodes Tx and is connected to a portion of the auxiliary electrode AET exposed inside the bank hole BH.

The embodiment of the disclosure further includes an anode electrode ANO integrated with a reflection electrode RFL. The embodiment of the disclosure further includes an organic compound layer between the reflection electrode integrated type anode electrode ANO and the cathode electrode CAT.

The TFT includes a gate electrode, which is formed along with a gate line using a gate metal layer, and a source electrode and a drain electrode which are formed along with a data line using a data metal layer. Each of the gate metal layer and the data metal layer may be a single layer or a multiple-layer selected from the group constituting of aluminum (Al), copper (Cu), molybdenum (Mo), chrome (Cr), titanium (Ti), gold (Au), silver (Ag), tungsten (W), or an alloy thereof. A gate insulating layer is interposed between the gate metal layer and the data metal layer.

The TFT is covered by the first insulating layer INS1. The first insulating layer INS1 may be formed of an inorganic insulating layer, such as silicon nitride (SiNx) and silicon oxide (SiOx), and a multiple-layer thereof.

The routing wire TW is arranged on the first insulating layer INS1 in parallel with the data line. In particular, the routing wire TW may be arranged so that the routing wire TW overlaps the data line (or the gate line). Thus, even when the routing wires TW are arranged in an active area, a reduction in an aperture ratio is not generated because the routing wires TW overlap the data lines (or the gate lines). The routing wire TW may be selected from the group constituting of aluminum (Al), copper (Cu), molybdenum (Mo), chrome (Cr), titanium (Ti), gold (Au), silver (Ag), tungsten (W), or an alloy thereof in the same manner as the data line (or the gate line).

The second insulating layer INS2 is positioned on the first insulating layer INS1, on which the routing wire TW is formed, and covers the routing wire TW. The second insulating layer INS2 performs a passivation function and may be formed of an organic insulating material such as polyacrylic and polyimide.

The second insulating layer INS2 includes first and second contact holes CH and CHa exposing the routing wire TW. Each of the first and second insulating layers INS1 and INS2 includes a drain hole DH exposing the drain electrode (or the source electrode) of the TFT.

The anode electrode ANO integrated with the reflection electrode RFL is positioned on the second insulating layer INS2 and is connected to the TFT through the drain hole DH passing through the first and second insulating layers INS1 and INS2. The reflection electrode RFL may include a metal material having a high reflectance, and the anode electrode ANO may include a transparent conductive material, such as indium tin oxide (ITO) or indium zinc oxide (IZO).

The auxiliary electrode AET is positioned on the second insulating layer INS2, passes through the second insulating layer INS2 through the first contact hole CH, and is connected to the routing wire TW. The auxiliary electrode AET positioned at an end of the active area is exposed to the outside, and a display drive and touch sensing IC 15 is connected to the exposed auxiliary electrode AET through a medium, for example, film-on glass (FOG). The auxiliary electrode AET positioned at the end of the active area passes through the second insulating layer INS2 through the second contact hole CHa and is connected to the routing wire TW.

The auxiliary electrode AET is formed on the same layers as the reflection electrode integrated type anode electrode ANO and is thus coplanar with both layers of the reflection electrode integrated type anode electrode ANO. The auxiliary electrode AET is also formed with the same materials as the reflection electrode integrated type anode electrode ANO. Because the auxiliary electrode AET is patterned at the same time as the reflection electrode integrated type anode electrode ANO, the manufacturing process is simplified. The auxiliary electrode AET connecting the routing wire TW and the touch and drive electrode Tx may be omitted. In this instance, the routing wire TW and the touch and drive electrode Tx are directly connected to each other.

The bank pattern BANK is positioned on the reflection electrode integrated type anode electrode ANO and defines an emission region of the pixel. In particular, the bank pattern BANK positioned on the auxiliary electrode AET among the bank patterns BANK includes the bank hole BH and exposes a portion of the auxiliary electrode AET. The bank pattern BANK may include an organic insulating material or an inorganic insulating material in consideration of interface characteristic between the bank pattern BANK and the barrier SPT.

The barrier SPT is positioned on the bank pattern BANK and is formed of a material, in which the interface bond characteristic between the bank pattern BANK and the barrier SPT is better than interface bond characteristic between the auxiliary electrode AET and the barrier SPT. For example, the barrier SPT may include a photosensitive organic insulating material. A cross section of the barrier SPT has an inverted taper shape, and one side or both sides of the barrier SPT having the inverted taper shape is positioned in the bank hole BH. The barrier SPT is tapered towards to the bank layer and substrate SUB such that the bottom portion of the barrier SPT closer to the substrate SUB is wider than the top portion of the barrier SPT further from the substrate SUB. Hence, the embodiment of the disclosure may easily implement an undercut structure of the barrier SPT. A separation space attributable to the undercut structure is provided between the auxiliary electrode AET and the barrier SPT in the bank hole BH.

The cathode electrode CAT is patterned and partitioned by the barrier SPT having the inverted taper shape to form the touch and drive electrodes Tx. The touch and drive electrode Tx is connected to a portion of the auxiliary electrode AET exposed to the inside of the bank hole BH. The touch and drive electrodes Tx is electrically connected to the display drive and touch sensing IC 15 via the bank hole BH through the auxiliary electrode AET and the routing wire TW.

An organic compound layer EL is positioned between the reflection electrode integrated type anode electrode ANO and the cathode electrode CAT and extends to the bank hole BH. The organic compound layer EL includes an electron transport layer ETL transferring electrons from the cathode electrode CAT, an emission layer EML related to a light emission, and hole related layers HIL and HTL receiving and transferring holes from the anode electrode ANO.

The touch sensor integrated type display device further includes a face seal FSL covering the cathode electrode CAT, a polarizing film POL attached to the face seal FSL, and a cover window CWIN attached to the polarizing film POL.

The face seal FSL encapsulates the OLED and protects the OLED from moisture and an external environment. The polarizing film POL is attached to the face seal FSL using an adhesive OCA and reflects external light, thereby increasing visibility. The cover window CWIN is attached to the polarizing film POL using an adhesive OCA and protects the touch sensor integrated type display device. When a touch driving signal TSD is applied to the touch and drive electrode Tx through the routing wire TW and the auxiliary electrode AET, charges are accumulated on the touch sensor. In this instance, when a user touches the surface of the cover window CWIN with his or her finger or a conductive object, a capacitance of a self-capacitive touch sensor varies due to a capacitance Cf between the touch and drive electrode Tx and the finger or the conductive object. Thus, it may be decided whether or not the self-capacitive touch sensor is touched using the fact that a capacitance of the self-capacitive touch sensor the user touches is different from a capacitance of the self-capacitive touch sensor the user does not touch.

Hereinafter, a method for manufacturing a touch sensor integrated type display device according to an exemplary embodiment of the disclosure is sequentially described with reference to FIGS. 4A to 4I.

Since a process for forming the TFT may use a related art process, which has been generally known, for the sake of brevity and ease of reading, a description of the process for forming the TFT is omitted.

Figure 4A:
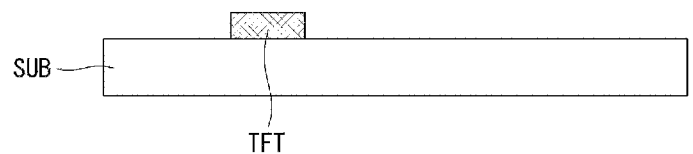
FIGS. 4A to 4I are cross-sectional views sequentially showing a method for manufacturing a touch sensor integrated type display device shown in FIG. 3.

Referring to FIG. 4A, the embodiment of the disclosure forms the TFTs and various lines on a substrate SUB. The various lines include gate lines, data lines, high potential power lines, low potential power lines, and the like.

Figure 4B:
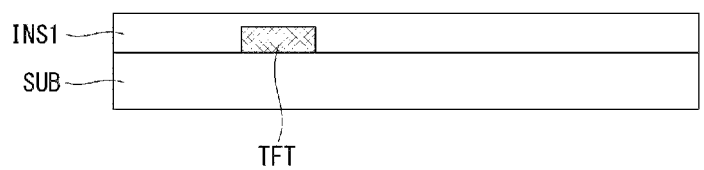

Referring to FIG. 4B, the embodiment of the disclosure applies a first insulating layer INS1 to the substrate SUB, on which the TFTs and the lines are formed.

Figure 4C:
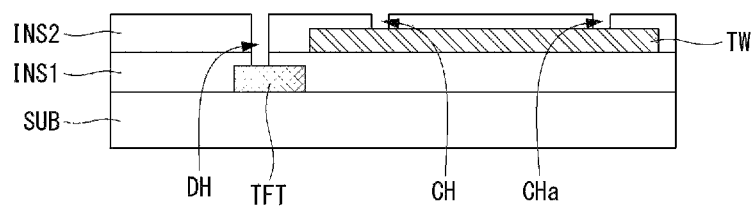

Referring to FIG. 4C, the embodiment of the disclosure applies a metal layer to the substrate SUB, on which the first insulating layer INS1 is formed, and patterns the metal layer to form a routing wire TW. The embodiment of the disclosure applies a second insulating layer INS2 to the routing wire TW and covers the routing wire TW. The embodiment of the disclosure patterns the first and second insulating layers INS1 and INS2 to form a drain hole DH exposing a portion of a drain electrode of the TFT and patterns the second insulating layer INS2 to form first and second contact holes CH and CHa exposing a portion of the routing wire TW.

Figure 4D:
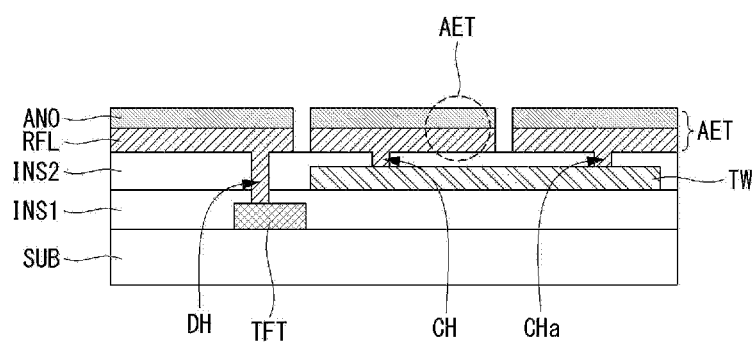

Referring to FIG. 4D, the embodiment of the disclosure sequentially applies a metal material having a high reflectance and a transparent conductive material to the substrate SUB, on which the drain hole DH, the first contact hole CH, and the second contact hole CHa are formed, through a sputtering method and then patterns them to form an anode electrode ANO integrated with a reflection electrode RFL connected to the TFT through the drain hole DH and to form an auxiliary electrode AET connected to the routing wire TW through the first and second contact holes CH and CHa. When the touch and drive electrode Tx is directly connected to the routing wire TW in a subsequent process, the auxiliary electrode AET used as a medium connecting the touch and drive electrode Tx and the routing wire TW may be omitted. However, because the routing wire TW underlying the auxiliary electrode AET may be damaged in a process for removing the auxiliary electrode AET, it is preferable, but not required, that the auxiliary electrode AET remains.

Figure 4E:
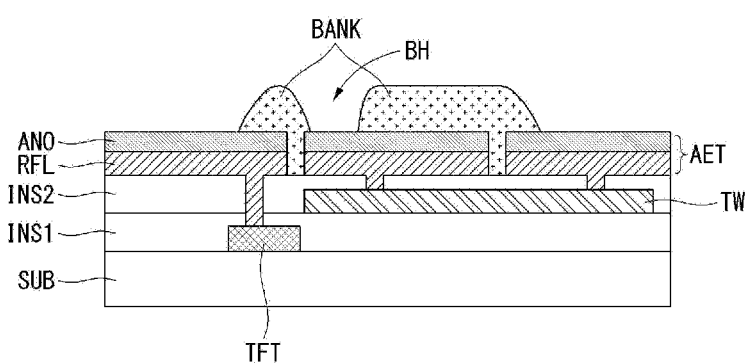

Referring to FIG. 4E, the embodiment of the disclosure applies an inorganic material or an organic material to the substrate SUB, on which the reflection electrode integrated type anode electrode ANO and the auxiliary electrode AET are formed, and patterns it to form a bank pattern BANK. The bank pattern BANK defines an emission region of the pixel. In particular, the bank pattern BANK positioned on the auxiliary electrode AET among the bank patterns BANK includes a bank hole BH and exposes a portion of the auxiliary electrode AET.

Figure 4F:
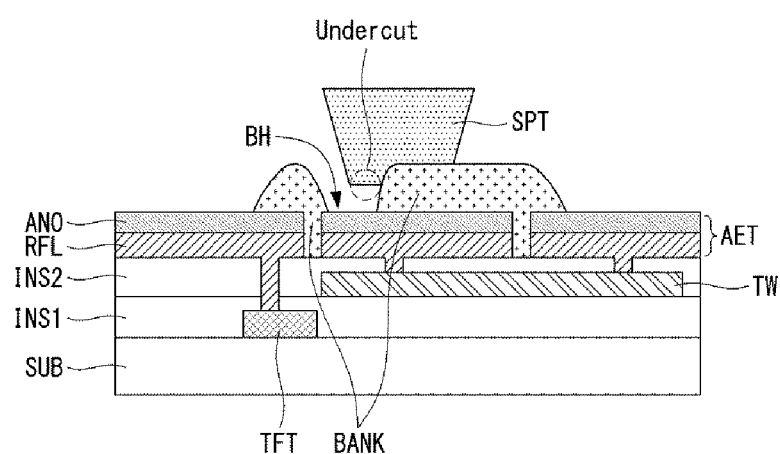

Referring to FIG. 4F, the embodiment of the disclosure applies a photosensitive material to the substrate SUB, on which the bank pattern BANK is formed, and patterns it to form a barrier SPT. A photoresist may be used as the photosensitive material. The photoresist indicates photosensitive polymer used in a photolithography process, and solution characteristic of the photoresist varies by decomposition or crosslink attributable to light energy. When a mask capable of selectively transmitting light is placed on the photoresist and is exposed, only a predetermined portion of the photoresist, on which the light is incident, is chemically changed. Subsequently, when the photoresist is developed, only an exposed portion or only an unexposed portion of the photoresist is melted. Hence, a pattern of the mask is implemented as the photoresist. The embodiment of the disclosure uses a negative photoresist, in which only a portion receiving light remains and a portion not receiving light is removed, as the photosensitive material, so that a cross section of the barrier SPT has an inverted taper shape.

It is important that the barrier SPT is formed of a material, in which an interface bond characteristic between the bank pattern BANK and the barrier SPT is better than an interface bond characteristic between the auxiliary electrode AET and the barrier SPT, so that an undercut structure is formed in the bank hole BH. A portion of the barrier SPT adjoining the bank pattern BANK forming the good interface bond characteristic is not undercut in the development process. On the other hand, a portion of the barrier SPT adjoining the auxiliary electrode AET forming the bad interface bond characteristic is easily undercut in the development process. Hence, the auxiliary electrode AET is easily exposed in the bank hole BH. FIG. 4F shows that one bank hole BH is formed on one side of the barrier SPT having the inverted taper shape, as an example. Other configurations may be used. For example, two bank holes BH may be respectively formed on both sides of the barrier SPT having the inverted taper shape.

Figure 4G:
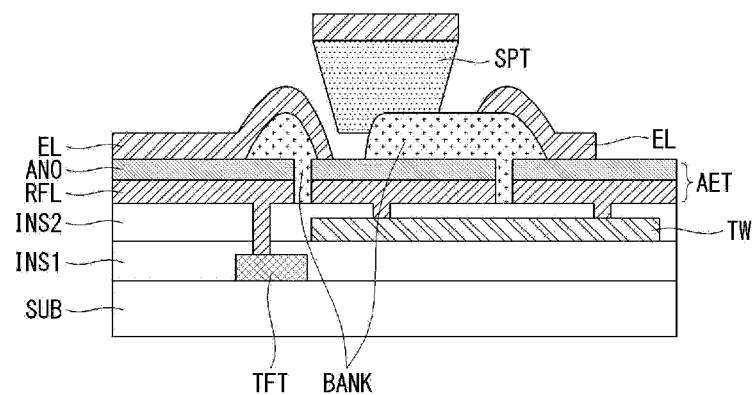

Referring to FIG. 4G, the embodiment of the disclosure forms an organic compound layer EL on the substrate SUB, on which the barrier SPT is formed, through a thermal evaporation method. A hole related layer and an electron related layer of the organic compound layer EL are commonly formed on the entire surface of the substrate SUB, and an emission layer of the organic compound layer EL is patterned on a per color basis using a metal mask. The organic compound layer EL extends to a portion of the bank hole BH exposed through the undercut structure.

Figure 4H:
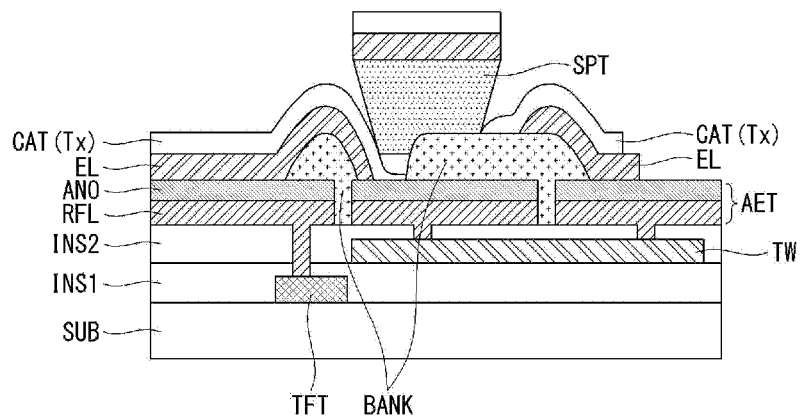

Referring to FIG. 4H, the embodiment of the disclosure forms a cathode electrode CAT on the substrate SUB, on which the organic compound layer EL is formed, through a sputtering process. Because step coverage characteristic of the sputtering process is better than the thermal evaporation process, penetration characteristic of the cathode electrode CAT into the bank hole BH is improved. Hence, connection characteristic between the cathode electrode CAT and the auxiliary electrode AET is improved. The cathode electrode CAT is patterned and partitioned by the barrier SPT of the inverted taper shape having the undercut structure to form the plurality of touch and drive electrodes Tx which are electrically separated from one another.

Figure 4I:
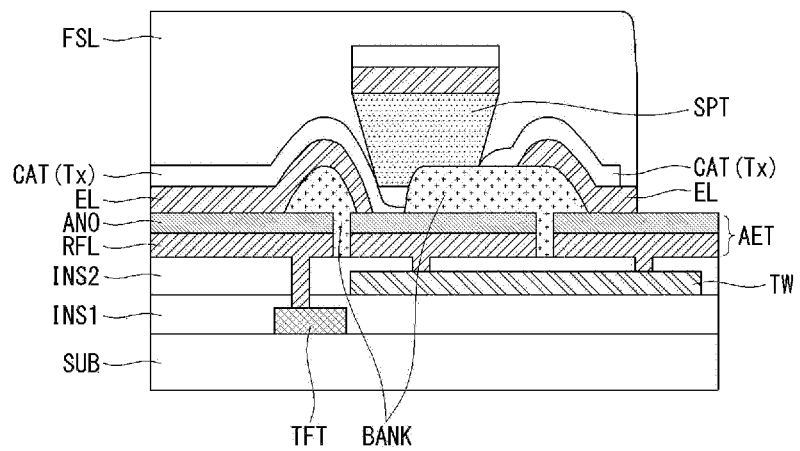

Referring to FIG. 4I, the embodiment of the disclosure applies a face seal FSL to the substrate SUB, on which the touch and drive electrodes Tx are formed, patterns it, and exposes the auxiliary electrode AET positioned at an end of an active area to the outside.

The embodiment of the disclosure sequentially attaches a polarizing film POL and a cover window CWIN to the face seal FSL through an attaching process. The embodiment of the disclosure attaches a display drive and touch sensing IC 15 to the auxiliary electrode AET exposed by the face seal FSL through a medium, for example, film-on glass (FOG).

Figure 5:
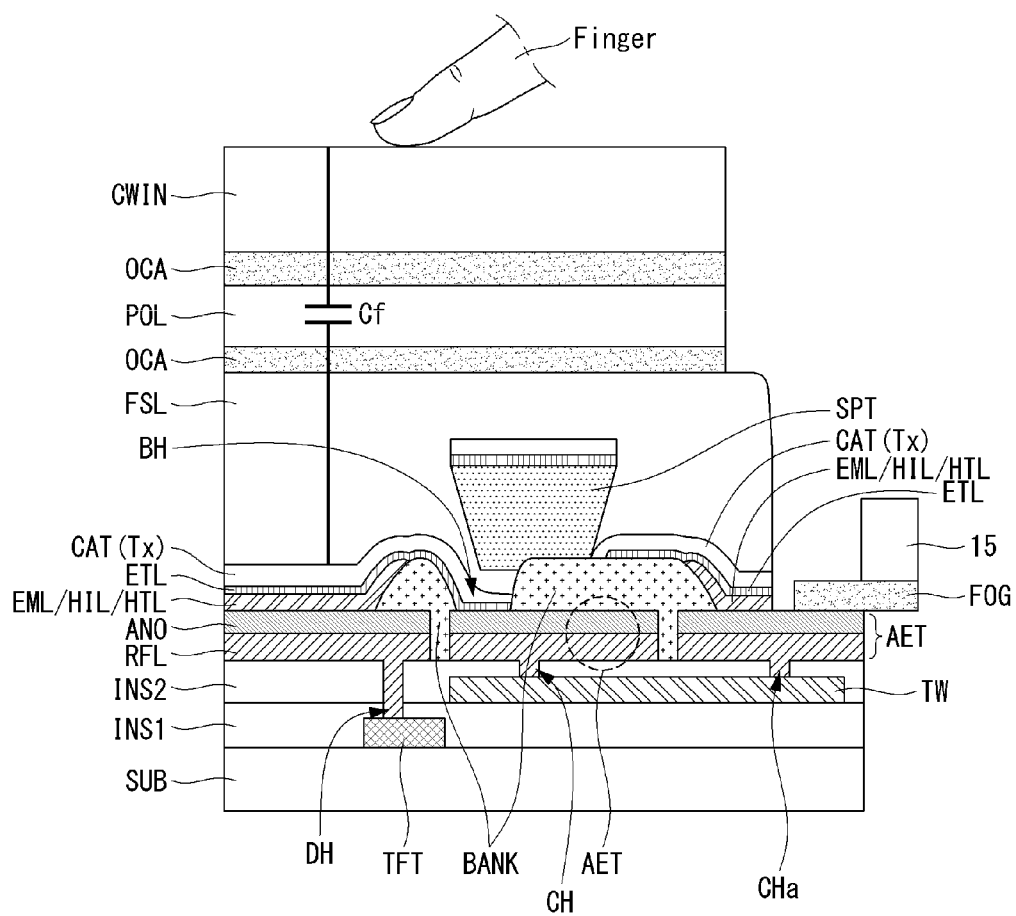
FIG. 5 is a cross-sectional view of a touch sensor integrated type display device according to another exemplary embodiment of the disclosure.

FIG. 5 is a cross-sectional view of a touch sensor integrated type display device, aimed at an OLED display, according to another exemplary embodiment of the disclosure. FIGS. 6A to 6I are cross-sectional views sequentially showing a method for manufacturing a touch sensor integrated type display device according to another exemplary embodiment of the disclosure.

Since configuration of the touch sensor integrated type display device shown in FIG. 5 is substantially the same as configuration of the touch sensor integrated type display device shown in FIG. 3 except a cross-sectional structure of an organic compound layer EL, a further description may be briefly made or may be entirely omitted. Further, the method for manufacturing the touch sensor integrated type display device shown in FIGS. 6A to 6I is substantially the same as the method for manufacturing the touch sensor integrated type display device shown in FIGS. 4A to 4I except a process for forming the organic compound layer EL shown in FIG. 6G, a further description may be briefly made or may be entirely omitted.

The organic compound layer EL shown in FIG. 5 is positioned between a reflection electrode integrated type anode electrode ANO and a cathode electrode CAT and includes an electron transport layer ETL transferring electrons from the cathode electrode CAT, an emission layer EML related to a light emission, and hole related layers HIL and HTL receiving and transferring holes from the anode electrode ANO, in the same manner as FIG. 3. Unlike FIG. 3, only the electron transport layer ETL of the organic compound layer EL extends to a bank hole BH, and the emission layer EML and the hole related layers HIL and HTL do not extend to the bank hole BH and are formed in an emission region of a pixel. The lower surface of the electron transport layer ETL is in contact with the auxiliary electrode AET, and the upper surface of the electron transport layer ETL is in contact with the cathode electrode CAT.

Figure 6A:
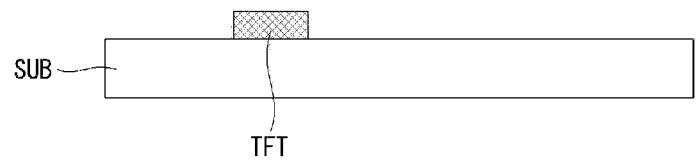
FIGS. 6A to 6I are cross-sectional views sequentially showing a method for manufacturing a touch sensor integrated type display device shown in FIG. 5.
Figure 6B:
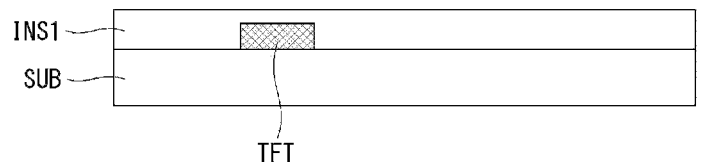
Figure 6C:
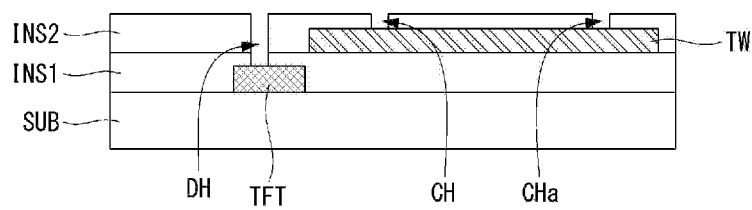
Figure 6D:
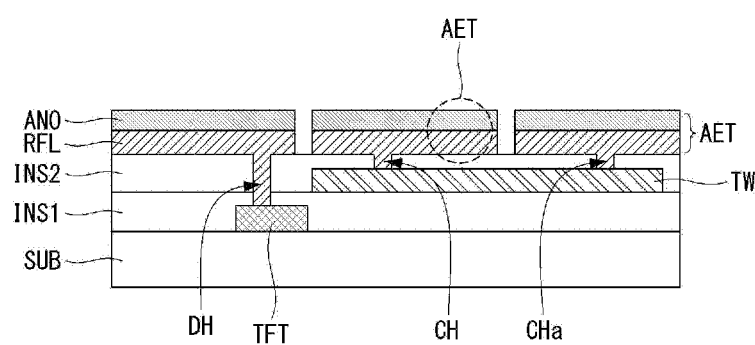
Figure 6E:
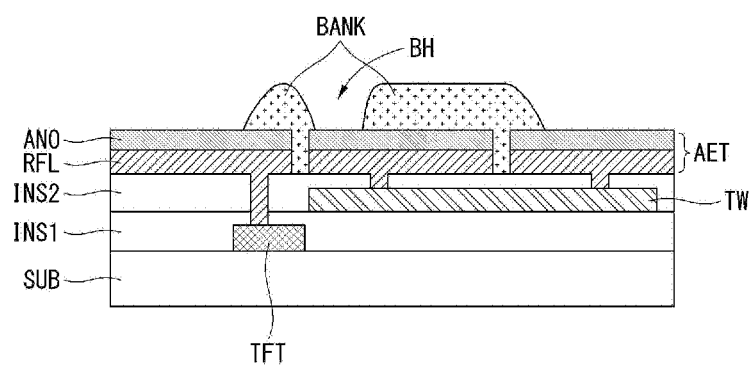
Figure 6F:
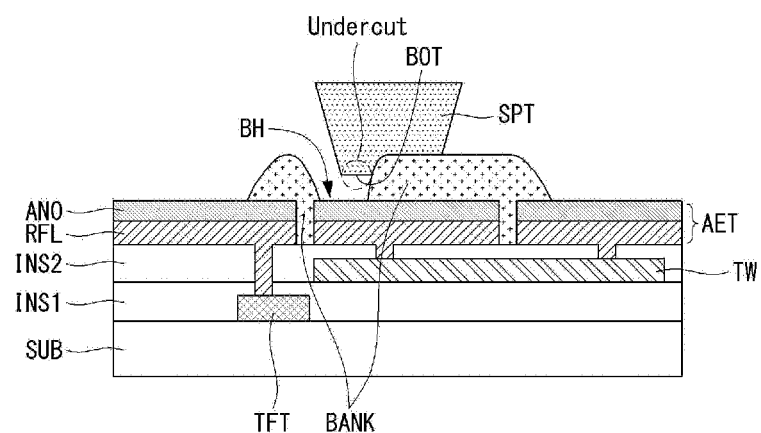
Figure 6G:
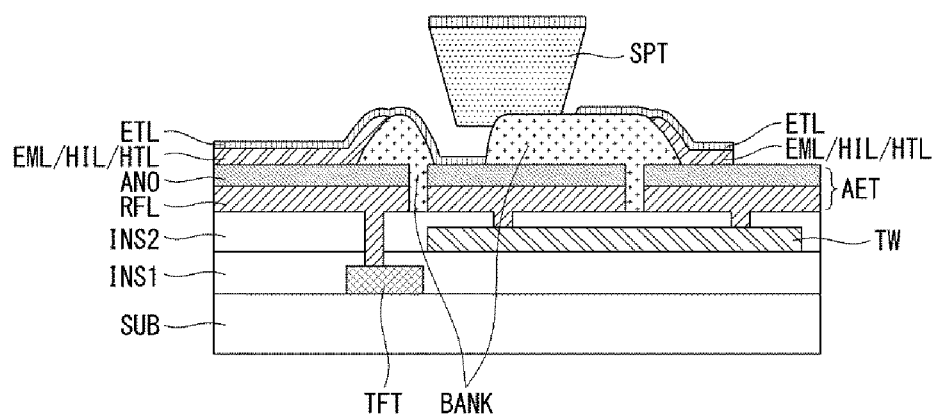
Figure 6H:
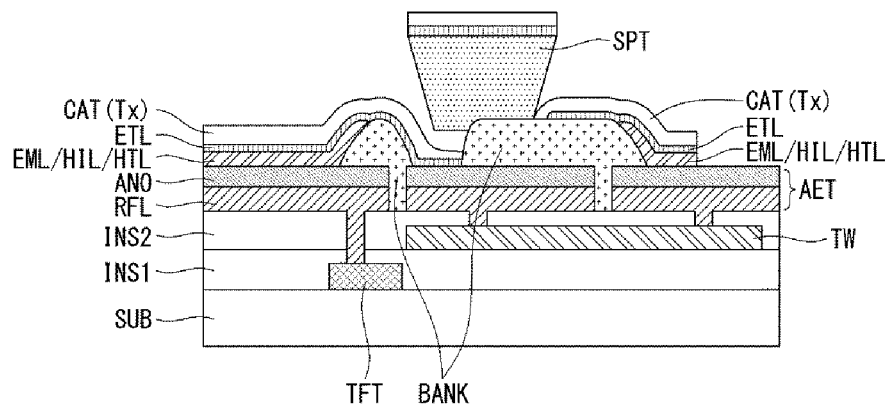
Figure 6I:
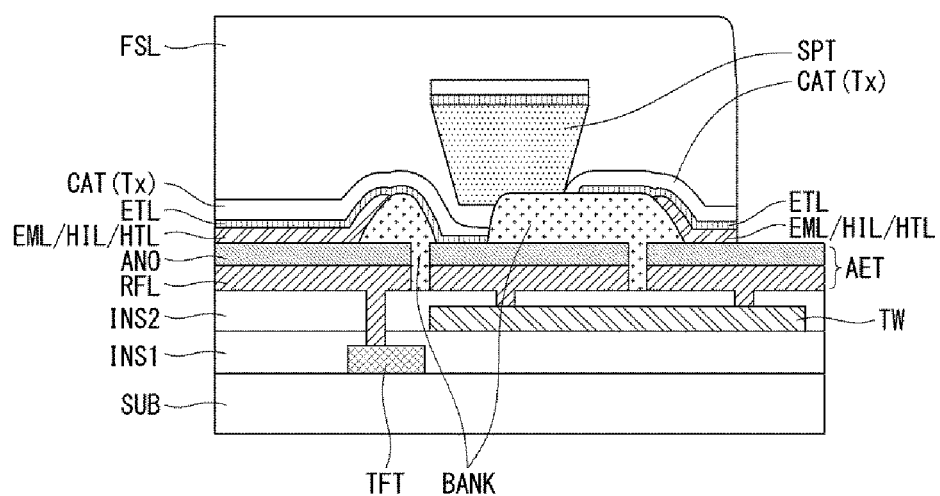

As shown in FIG. 6G, a formation structure of the organic compound layer EL results from process characteristics, in which the electron transport layer ETL is formed through a thermal evaporation method and the emission layer EML and the hole related layers HIL and HTL are formed through a solution application method. Examples of the solution application method include a spin coating method, a dip coating method, and an inkjet printing method. The electron transport layer ETL is unsuitable to use the solution application method because of its formation material characteristic. The electron transport layer ETL formed through the thermal evaporation method is formed of a conductive material and is very thin. Because the emission layer EML and the hole related layers HIL and HTL formed through the solution application method do not extend to the bank hole BH and are formed in the emission region of the pixel, an exposure area of an auxiliary electrode AET in the bank hole BH in FIG. 5 is relatively larger than that in FIG. 3. Thus, penetration characteristic of touch and drive electrodes Tx into the bank hole BH is improved in a subsequent process for forming the touch and drive electrodes Tx, and contact characteristic between the touch and drive electrode Tx and the auxiliary electrode AET may be improved. The cathode electrode CAT is patterned and partitioned by a barrier SPT of an inverted taper shape having an undercut structure to form the touch and drive electrodes Tx, in the same manner as FIG. 3.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch sensing display device, comprising:
   a bank layer having a bank hole;
   a mesh barrier on the bank layer;
   a cathode electrode of at least an organic light emitting diode (OLED), the mesh barrier being between the cathode electrode and one or more other cathode electrodes, the cathode electrode also being a touch electrode and a portion of the cathode electrode being in the bank hole and under the mesh barrier;
   a routing wire electrically connected to the cathode electrode via the bank hole to carry a common voltage and a touch driving signal to the cathode electrode;
   an anode of the organic light emitting diode; and
   an auxiliary electrode coplanar with and comprised of a same material as the anode, the auxiliary electrode electrically connecting the routing wire to the cathode electrode.

2. The touch sensing display device of claim 1, further comprising:
   a substrate,
   wherein a cross section of the mesh barrier has an inverted tapered shape that is tapered towards the substrate, at least a portion of the bank hole corresponding to an undercut region under the mesh barrier.

3. The touch sensing display device of claim 1, wherein the portion of the cathode electrode located in the bank hole is in contact with the auxiliary electrode.

4. The touch sensing display device of claim 1, wherein a portion of an organic compound layer of the OLED is located in the bank hole and in contact with the auxiliary electrode.

5. The touch sensing display device of claim 4, wherein the organic compound layer comprises an electron transport layer, an emission layer, and hole transport layer, and a portion of the electron transport layer is in the bank hole while the emission layer and hole transport layer are not in the bank hole, the portion of the electron transport layer being between the cathode electrode and the auxiliary electrode.

6. The touch sensing display device of claim 1, wherein a reflection electrode is integrated with the anode, and wherein the auxiliary electrode is also coplanar with and comprised of a same material as the reflection electrode.

7. The touch sensing display device of claim 1, further comprising:
   an integrated circuit to generate the common voltage and touch driving signal; and
   another auxiliary electrode coplanar with and comprised of a same material as the anode, the another auxiliary electrode electrically connecting the routing wire to the integrated circuit.

8. A method of manufacturing a touch sensing display device, the method comprising:
   forming a bank layer having a bank hole;
   forming a mesh barrier on the bank layer;
   forming a cathode electrode of at least an organic light emitting diode (OLED), the mesh barrier being between the cathode electrode and other cathode electrodes, the cathode electrode also being a touch electrode and a portion of the cathode electrode being formed in the bank hole and under the mesh barrier;
   forming a routing wire to carry a common voltage and a touch driving signal to the cathode electrode; and
   forming an anode of the organic light emitting diode and forming an auxiliary electrode coplanar with and comprised of a same material as the anode,
   wherein the cathode electrode is electrically connected to the routing wire through the auxiliary electrode.

9. The method of claim 8, wherein the mesh barrier is formed into an inverted tapered shape that is tapered towards the substrate and is undercut in the bank hole while being formed.

10. The method of claim 8, wherein the portion of the cathode electrode located in the bank hole is formed in contact with the auxiliary electrode.

11. The method of claim 8, further comprising:
   forming an organic compound layer of the OLED, a portion of the organic compound layer of the OLED formed in the bank hole and in contact with the auxiliary electrode.

12. The method of claim 11, further comprising:
   forming a hole transport layer of the OLED;
   forming an emission layer of the OLED; and
   forming an electron transport layer of the OLED, a portion of the electron transport layer formed in the bank hole while the emission layer and the hole transport layer are not in the bank hole, the portion of the electron transport layer being between the cathode electrode and the auxiliary electrode.

13. The method of claim 8, wherein a reflection electrode is integrated with the anode, and wherein the auxiliary electrode is formed to be coplanar with and formed from a same material as the reflection electrode.

14. The method of claim 8, further comprising:
   forming another auxiliary electrode coplanar with and comprised of the same material as the anode, the another auxiliary electrode electrically connecting the routing wire to an integrated circuit.

15. The method of claim 8, wherein the cathode electrode is formed with sputtering.

* * * * *